(12) United States Patent
Johnson

(10) Patent No.: US 10,931,315 B2
(45) Date of Patent: Feb. 23, 2021

(54) ERROR CORRECTION CODED BINARY ARRAY

(71) Applicant: Raytheon Company, Waltham, MA (US)

(72) Inventor: Jeffrey Johnson, Madison, AL (US)

(73) Assignee: Raytheon Company, Waltham, MA (US)

( * ) Notice: Subject to any disclaimer, the term of this patent is extended or adjusted under 35 U.S.C. 154(b) by 0 days.

(21) Appl. No.: 16/382,487

(22) Filed: Apr. 12, 2019

(65) Prior Publication Data

US 2019/0319648 A1    Oct. 17, 2019

Related U.S. Application Data

(60) Provisional application No. 62/657,070, filed on Apr. 13, 2018.

(51) Int. Cl.
*H03M 13/00* (2006.01)
*H03M 13/09* (2006.01)
(Continued)

(52) U.S. Cl.
CPC ....... *H03M 13/612* (2013.01); *H03M 13/098* (2013.01); *H03M 13/1162* (2013.01); *H03M 13/25* (2013.01)

(58) Field of Classification Search
CPC ............. H03M 13/612; H03M 13/098; H03M 13/1163; H03M 13/25
See application file for complete search history.

(56) References Cited

U.S. PATENT DOCUMENTS 3,946,395 A    3/1976    Kirchhoff
4,103,304 A    7/1978    Burnham et al.
(Continued)

FOREIGN PATENT DOCUMENTS

GB    2130798 A    6/1984

OTHER PUBLICATIONS

PCT International Search Report dated Jul. 12, 2019 for International Application No. PCT/US2019/027171; 6 pages.
(Continued)

*Primary Examiner* — Samir W Rizk
(74) *Attorney, Agent, or Firm* — Daly, Crowley, Mofford & Durkee LLP

(57) ABSTRACT

A system and method for detecting an angle of arrival (AoA) of incident waves are disclosed. An array of wave sensors each transduce incident waves into an electrical signal, which is then provided an additional phase shift that varies between sensors. Electrical signals from adjacent wave sensors, having different phase shifts, are coupled via a phase detector to classify the incident waves into "zero" and "one" AoA regions for that sensor pair. The outputs from many such phase detectors are combined to divide the space facing the array into many subregions, each subregion being associated with a unique codeword. Incident waves cause detection of codewords, that are decoded according to error detection and correction techniques, such as selecting, from a list, the codeword having a minimum Hamming distance to a received codeword. The decoder then outputs data indicating an AoA subregion associated with the decoded codeword.

20 Claims, 16 Drawing Sheets

(51) Int. Cl.
*H03M 13/11* (2006.01)
*H03M 13/25* (2006.01)

(56) References Cited

U.S. PATENT DOCUMENTS

| | | | |
|---|---|---|---|
| 4,203,114 A | 5/1980 | Gerst et al. | |
| 2013/0115969 A1* | 5/2013 | Holmes | G06Q 30/02 |
| | | | 455/456.1 |
| 2014/0327579 A1* | 11/2014 | Hart | G01S 3/38 |
| | | | 342/374 |
| 2017/0212205 A1* | 7/2017 | Bialer | G01S 7/03 |

OTHER PUBLICATIONS

PCT International Written Opinion dated Jul. 12, 2019 for International Application No. PCT/US2019/027171; 9 pages.
PCT International Preliminary Report dated Oct. 22, 2020 for International Application No. PCT/US2019/027171; 9 pages.

* cited by examiner

FIG. 4A

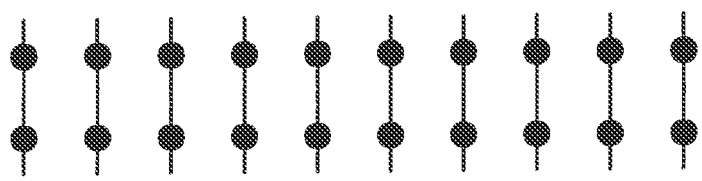
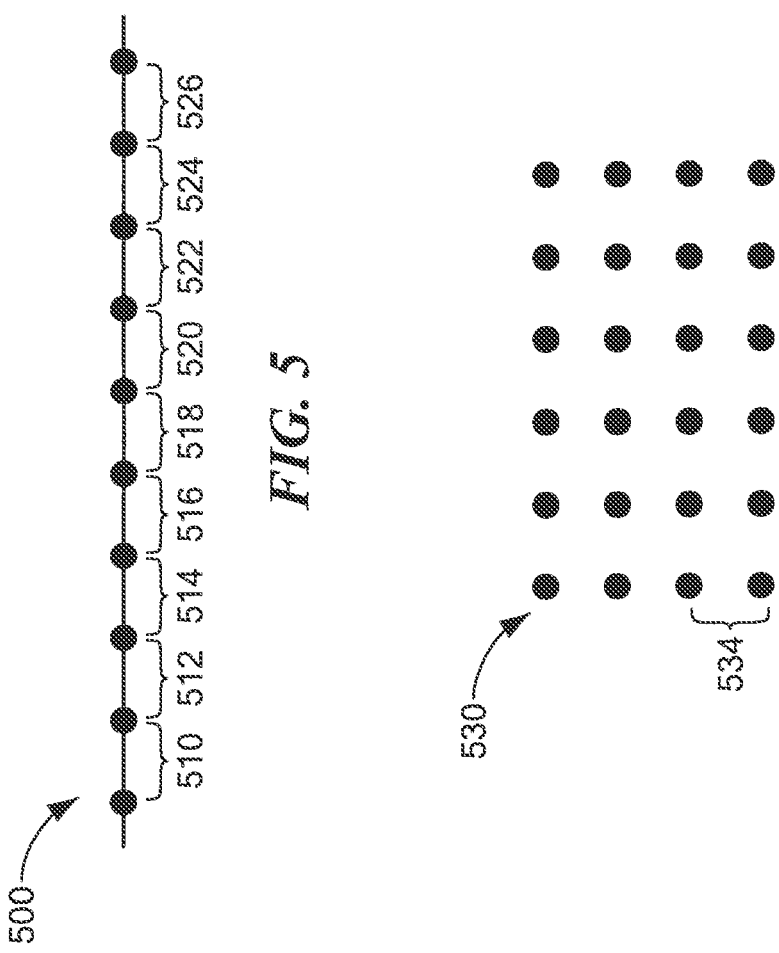

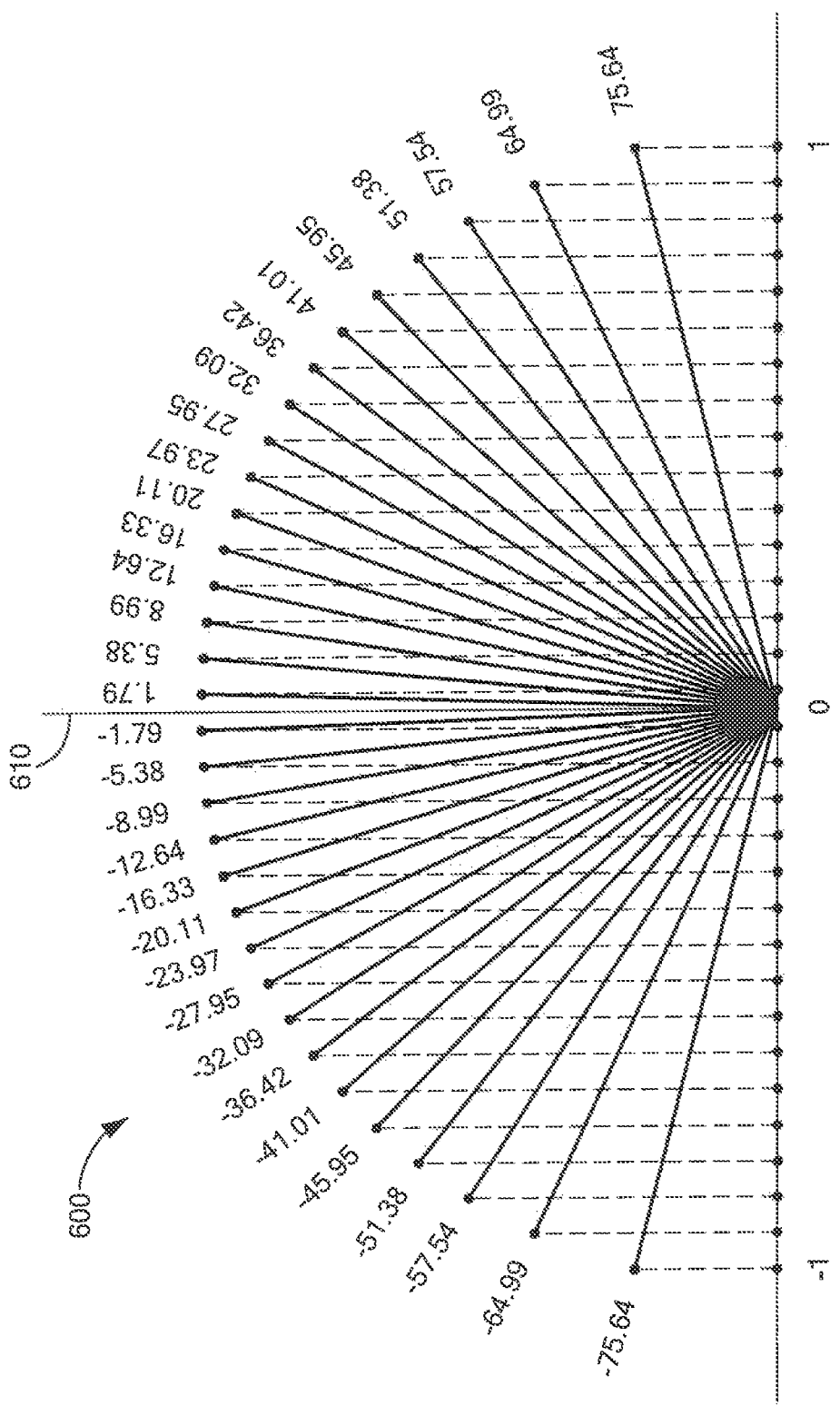

ERROR CORRECTION CODED BINARY ARRAY

CROSS-REFERENCE TO RELATED APPLICATIONS

This application claims the benefit of U.S. Provisional Application 62/657,070, filed Apr. 13, 2018, the contents of which are incorporated herein by reference in their entirety.

FIELD

The disclosure pertains generally to digital beamforming in array antennas, and more particularly to systems for determining an angle of arrival of incident waves.

BACKGROUND

Antenna arrays used for signal detection and angle of arrival ("AoA") estimation are often complex hardware assemblies, which means they often have high Cost, Size, Weight, and Power (hereafter "C-SWAP") requirements and often require precision calibration. Some applications could benefit from arrays with lower complexity, lower C-SWAP, and simpler operation.

SUMMARY OF DISCLOSED EMBODIMENTS

Disclosed embodiments provide techniques for signal detection and angle of arrival ("AoA") estimation using an array of binary phase detecting element pairs. Each element pair includes first and second receive elements (e.g. antenna elements or sonar transducers) such that the phase between the two receive elements depends on the AoA of a signal and is detected as a binary value 1 or 0. The angular 1 and 0 regions are determined by introducing a delay on one of the two receive elements. The binary values, or bits, of the array of binary phase detecting element pairs, each with different angular 1 and 0 regions, create a unique pattern of ones and zeros, called a "code word," that indicates the presence of a signal within an AoA sector. The code words are designed to have a minimum number of bits that are different between adjacent code words, thereby enabling error correction in the presence of some number of bit errors due to noise. When no signal is present the noise results in invalid code words. When valid code words are decoded (including correction of errors), a signal is detected and its AoA is inferred from the code word. In embodiments, each element pair requires a binary phase detector. The bits from each element pair are combined by decoding the received code words, not by combining their signals coherently. The resulting array is very low complexity and could potentially be implemented with low C-SWAP.

Illustrative embodiments combine a signal arriving at multiple array elements using digital rather than analog techniques. The array generates digital code words much like error correction codes that can be decoded to detect the presence of a signal and determine its AoA. Because the ones and zeroes of each binary phase detecting element pair depend only on the spacing and orientation of that pair, the element pairs could be placed in any arbitrary pattern and still operate the same. Element pairs could be oriented horizontally and vertically to generate code words that depend on both azimuth and elevation (e.g. in two dimensions). Over multiple samples code words can be detected using sequential detection techniques using either hard or soft decision.

Thus, a first embodiment is a system for detecting an angle of arrival of incident waves. The system includes a plurality of wave sensors for transducing the incident waves into an electrical signal. Each wave sensor is coupled to a corresponding electrical terminal according to a respective electrical signal delay. The system also includes a plurality of phase detectors, each phase detector coupled to two such electrical terminals for digitally outputting either a one or a zero according to a relative phase of electrical signals present at the two terminals. The system further includes a decoder, coupled to the plurality of phase detectors, configured to output, as data indicating the angle of arrival of the incident waves, a decoding of the digital output of the plurality of phase detectors.

In some embodiments, the plurality of wave sensors comprises a pressure sensor, or a photodetector, or a radio frequency (RF) antenna element.

In some embodiments, the plurality of phase detectors comprises an electric signal difference circuit, or an electric signal mixer, or a lead-lag detector.

In some embodiments, the decoder is configured to (a) determine a Hamming distance between the digital output of the plurality of phase detectors and each code word in a predefined code book; and (b) output as the data indicating the angle of arrival, an angular value associated with the code word having a minimum such Hamming distance. Instead of performing process (b), the decoder may output an indication that no incident waves were detected when the minimum Hamming distance is greater than a given threshold.

In some embodiments, the plurality of wave sensors are physically arranged as a linear array.

In some embodiments, the plurality of wave sensors are physically arranged as a rectangular array having a horizontal direction and a vertical direction.

In some such embodiments, the plurality of phase detectors may include a plurality of horizontal phase detectors, each coupled to two horizontally adjacent terminals, and a plurality of vertical phase detectors, each coupled to two vertically adjacent terminals. If so, the decoder may be configured to output both a decoding of the digital output of the plurality of horizontal phase detectors as a horizontal angle of arrival, and a decoding of the digital output of the plurality of vertical phase detectors as a vertical angle of arrival.

A second embodiment is a method of detecting an angle of arrival of incident waves. The method includes transducing the incident waves by a plurality of wave sensors into a corresponding plurality of electrical signals, each such electrical signal having a respective electrical signal delay. The method also includes, for each pair of adjacent wave sensors, digitally outputting to a decoder either a one or a zero according to a relative phase of their corresponding electrical signals. The method further includes outputting, by the decoder as data indicating the angle of arrival of the incident waves, a decoding of the digital outputs.

In some embodiments, transducing comprises transducing using a pressure sensor, or a photodetector, or a radio frequency (RF) antenna element.

In some embodiments, digitally outputting comprises digitally outputting from an electric signal difference circuit, or an electric signal mixer, or a lead-lag detector.

Some embodiments include determining a Hamming distance between the digital output of the plurality of phase detectors and each code word in a predefined code book; and outputting as the data indicating the angle of arrival, an angular value associated with the code word having a minimum such Hamming distance. Instead of performing process (b), an embodiment may include outputting an indication that no incident waves were detected when the minimum Hamming distance is greater than a given threshold.

In some embodiments, the plurality of wave sensors is arranged as a rectangular array having a horizontal direction and a vertical direction, and outputting by the decoder comprises outputting both a decoding of the digital outputs of horizontally adjacent wave sensors as a horizontal angle of arrival, and a decoding of the digital outputs of vertically adjacent wave sensors as a vertical angle of arrival.

A third embodiment is a tangible, computer-readable storage medium, in which is non-transitorily stored computer program code that, when executed by a computing processor, performs the method of the second embodiment or any of its above-described variations.

It is appreciated that a person having ordinary skill in the art may embody the concepts, techniques, and structures disclosed herein in other manners and using different means, and that the above summary of disclosed embodiments should not be viewed as comprehensive or limiting.

DESCRIPTION OF THE SEVERAL VIEWS OF THE DRAWINGS

The manner and process of making and using the disclosed embodiments may be appreciated by reference to the drawings, in which:

FIGS. 4 and 4A schematically show creation of binary code words using a linear sensor array;

FIGS. 5 to 5B schematically show various sensor arrays for detecting AoA having different physical arrangements of sensor elements;

FIG. 6 indicates, for an illustrative embodiment, angles of arrival that are equally spaced in sine space;

DETAILED DESCRIPTION

In this specification, including the appended claims, the following quoted terms shall have the indicated meanings that are not limited to specific embodiments, except where expressly indicated otherwise:

"Wave" means a moving disturbance in the energy level of a field. Non-limiting examples of waves are liquid waves, sound waves, and electromagnetic waves (including light).

"Sensor" or "sensor element" means a machine for converting received waves into an electrical signal. A sensor may, but need not, be designed to also convert received electrical signals into radiation (of whatever wavelength) for transmission. Non-limiting examples of sensor elements are pressure sensors, microphones, photodetectors, and RF antenna elements.

"Sensor array" means one or more sensor elements coupled together to receive and characterize waves. An antenna array is a sensor array, as is a towed sonar array.

"Angle of arrival" means an angle of received waves relative to a reference direction. For antenna arrays, the reference direction may be a physical or effective boresight of the array.

"Code word" means a concatenation of bits (i.e. ones and zeroes) that are each produced using a respective pair of sensor elements.

"Hamming distance" between two strings of bits means the number of one bits in the bitwise exclusive or (XOR) of the two strings of bits.

Figure 1:
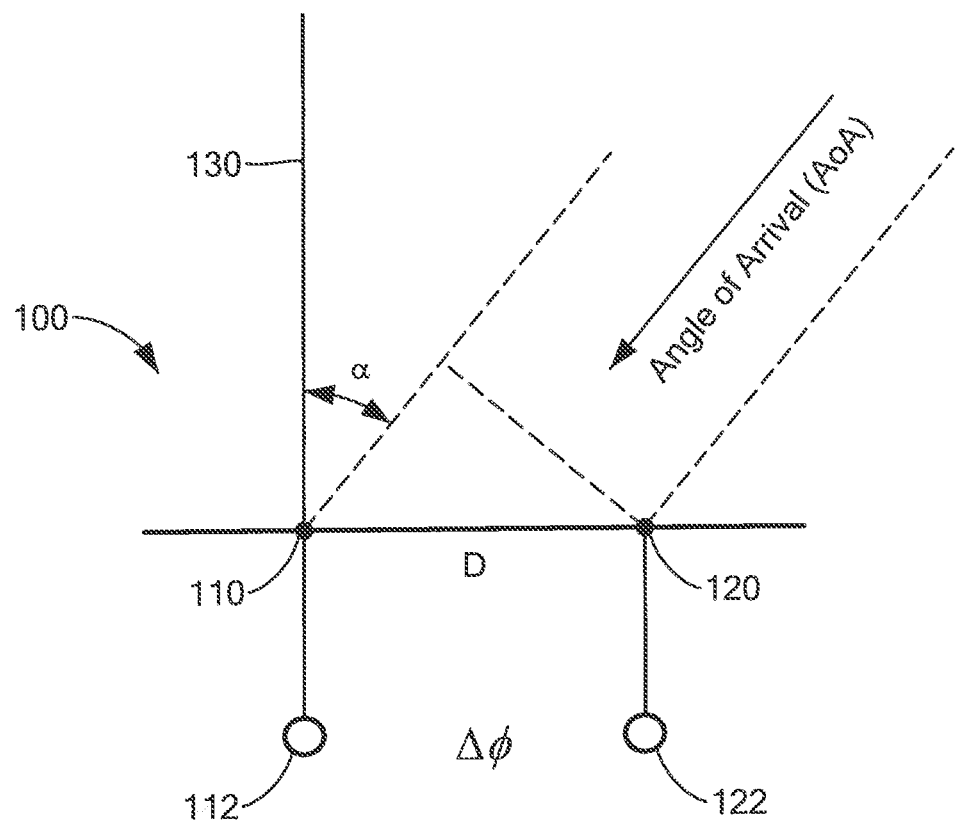
FIG. 1 schematically shows how a phase difference $\Delta\phi$ of incident waves, detected by a pair of adjacent elements, indicates an angle of arrival (AoA)

In FIG. 1 is shown how a phase difference $\Delta\phi$ of incident waves, detected by a pair of adjacent antenna elements, indicates an angle of arrival (AoA) $\alpha$ of the waves. A sensor array 100 is shown with two wave sensors 110, 120 separated by a distance D. These wave sensors 110, 120 transduce incident waves into an electrical signal (e.g. a current or a voltage) that varies according to a magnitude or amplitude of the waves. The wave sensors 110, 120 have respective terminals 112, 122 for providing these electrical signals to external circuitry (e.g. a phase detector as described below). The sensor array 100 has a boresight 130 that is perpendicular to the line between the wave sensors 110 and 120 which may be used as a reference direction for indicating the AoA $\alpha$ of arriving waves.

Waves may approach the sensor array 100 from any direction, namely their angle of arrival $\alpha$ relative to the boresight 130. The wave sensors 110, 120 will measure different phases $\phi$ of the waves. If the waves have a wavelength $\lambda$, then applying conventional geometry to the sensor array 100 yields the formula $\Delta\phi=2\pi(D/\lambda)\sin(\alpha)$ for the phase difference, where $\alpha$ is the angle of arrival. In what follows, the variable u will be used as a substitute for $\sin(\alpha)$, so that the phase difference formula becomes $\Delta\phi=2\pi(D/\lambda)\times u$. Thus, once the characteristic dimension D of the sensor array 100 is specified, the phase difference detectable by the pair of wave sensors 110, 112 is proportional to the sine of the angle of arrival (i.e., u) and inversely proportional to the wavelength of the incident waves (i.e., $\lambda$).

The phase difference $\Delta\phi$ may be measured using any phase detector technology known in the art for this purpose. For example, if the wave sensors 110, 120 transduce the incident waves proportional to their phases (e.g. as a voltage, which could be generated by mixing with a reference signal to obtain an absolute phase). Then, a phase detector may simply divide the difference of the two voltages by the range between the maximum and minimum voltages to determine the phase difference. Alternately, the phase detector may be a circuit that mixes or multiplies the signals directly, which creates a voltage proportional to the phase difference. Or, the phase detector may include leading/lagging circuitry.

It is appreciated that in illustrative embodiments, the actual magnitude of the phase $\Delta\phi$ is not needed to perform the encoding described below, but only its sign. That is, if the sign is negative then the phase detector may output a zero, while if the sign is positive then the phase detector may output a one (or vice versa). Thus, the function of the phase detector differs from that of an interferometer or monopulse where angle is computed from the measured phase, because in those cases the phase difference is directly related to the angle offset. However, in illustrative embodiments, the phase detector only needs to determine whether the phase difference is on one side of the phase boundary or the other.

Figure 2:
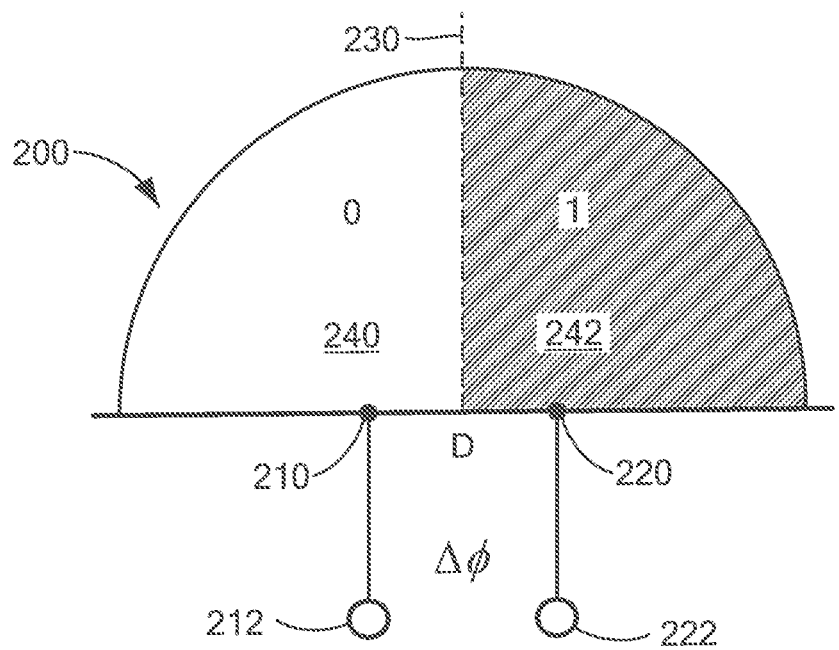
FIGS. 2 and 2A schematically show an assignment of bit values as a first function of an AoA to a pair of adjacent elements according to an illustrative embodiment.
Figure 2A:
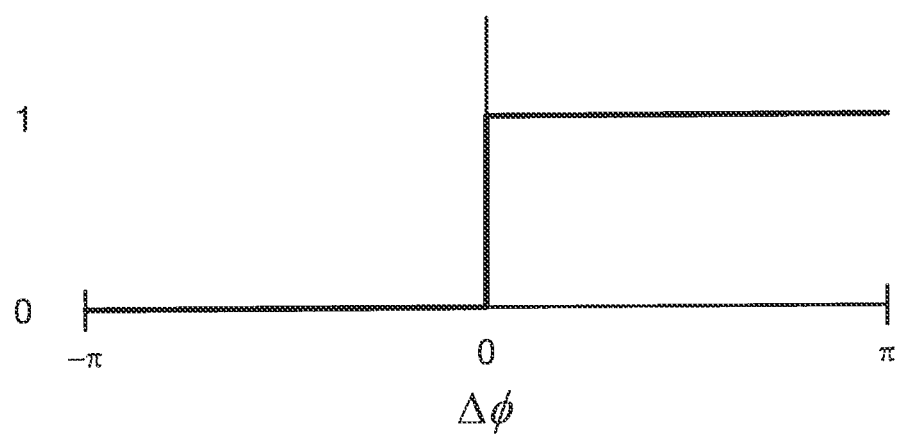

In FIGS. 2 and 2A is shown an assignment of digital values as a first function of an angle of arrival to a pair of adjacent antenna elements according to an illustrative embodiment. The sensor array 200 of FIG. 2 is similar to, and may be identical with, the sensor array 100 of FIG. 1. The sensor array 200 includes two wave sensors 210, 220, separated by a distance D and having respective terminals 212, 222 for providing electrical signals to external circuitry. The sensor array 200 has a boresight 230.

In accordance with illustrative embodiments, the phase difference $\Delta\phi$ is measured at the terminals 212, 222 and, according to the measurement, incoming waves are classified by their direction. The classifying function is plotted in FIG. 2A. Thus, waves whose angle of arrival is between $-\pi$ radians and 0 radians relative to the boresight 230 (i.e. passing through the approach region 240) are assigned the digital value zero. Similarly, waves whose angle of arrival is between 0 radians and $+\pi$ radians relative to the boresight 230 (i.e. passing through the approach region 242) are assigned the digital value one.

Figure 3:
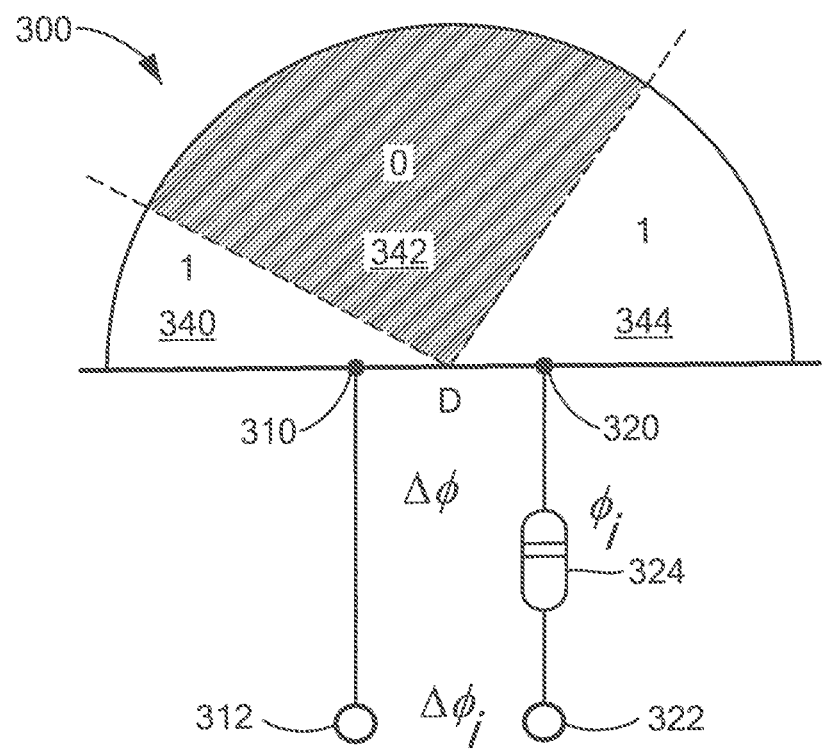
FIGS. 3 and 3A schematically show an assignment of bit values as a second function of an AoA using a fixed delay line.
Figure 3A:
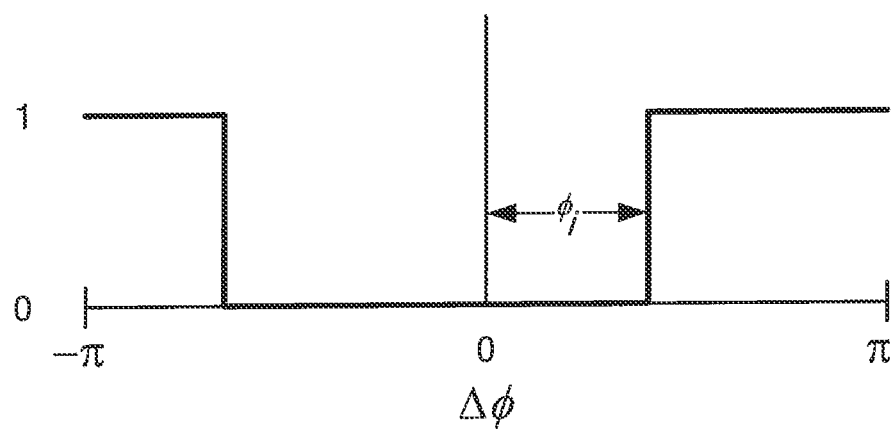

In FIGS. 3 and 3A is shown an assignment of digital values as a second function of an angle of arrival, using a fixed delay line according to another illustrative embodiment. The sensor array 300 of FIG. 3 is similar to the sensor array 100 of FIG. 1 and the sensor array 200 of FIG. 2. The sensor array 300 includes two wave sensors 310, 320, separated by a distance D and having respective terminals 312, 322 for providing electrical signals to external circuitry. Unlike the sensor arrays of FIGS. 1 and 2, however, the sensor array 300 includes a delay line 324 that shifts the phase of the measured waves by a fixed phase $\phi_i$.

The delay line 324 may be implemented, for example, by providing an extra length of conductor between the sensor 320 and the terminal 322 (e.g. as a cable or a printed circuit board trace), or as a ferrite phase shifter, or as a surface acoustic wave (SAW) device, or by a resistor-capacitor (RC) circuit, or by any of a variety of active circuit techniques, all known in the art. It is appreciated that a phase delay is the same as a time delay for incident waves having a given frequency.

Because the sensor array 300 includes the delay line 324, the phase that appears at the terminal 322 lags behind the phase of the initially transduced signal from the wave sensor 320. The result of the delay is to shift the classifying function of FIG. 2A to the right by the fixed amount $\phi_i$; the resulting classifying function is plotted in FIG. 3A. In turn, this shift causes the angle of arrival to be classified on the basis of rotated sectors 340, 342, and 344. In particular, the "zero" sector 240 of FIG. 2 is rotated to become the "zero" sector 342 of FIG. 3; the "one" sector 242 is rotated to become the "one" sector 344; and a new "one" sector 340 appears. The phase (or time) delay introduced by the delay line 324 may be chosen by adjusting the operational parameters of the delay line 324, thereby "steering" the boundaries between the zero-one and one-zero transitions to any specific angles that may be desired. As described in more detail below, these specific angles may be chosen as operational parameters to define desired subsectors or subregions for encoding.

Figure 4:
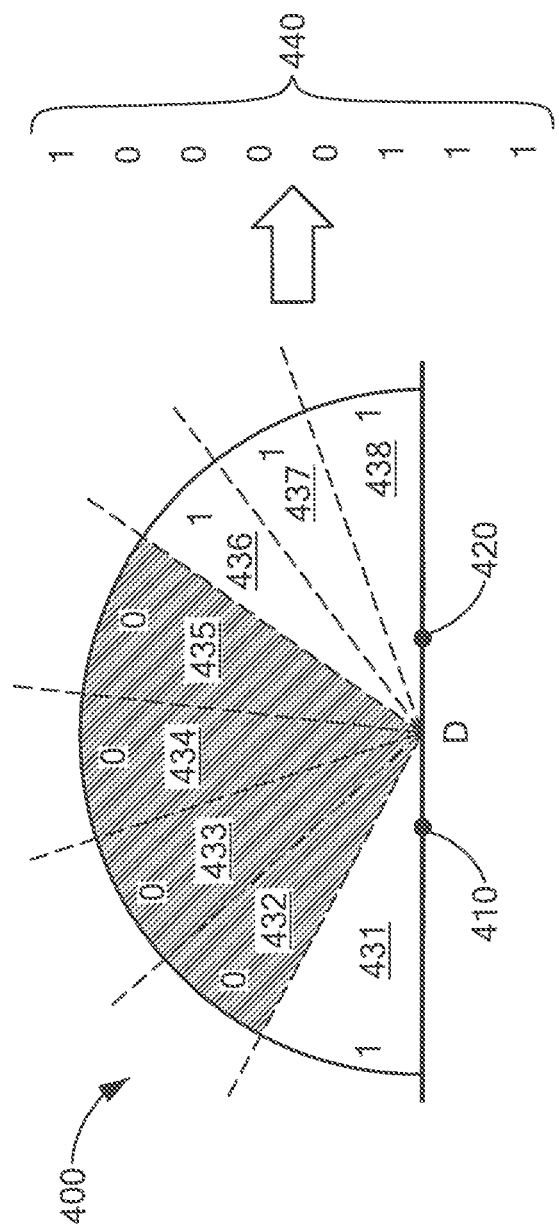
Figure 4A:
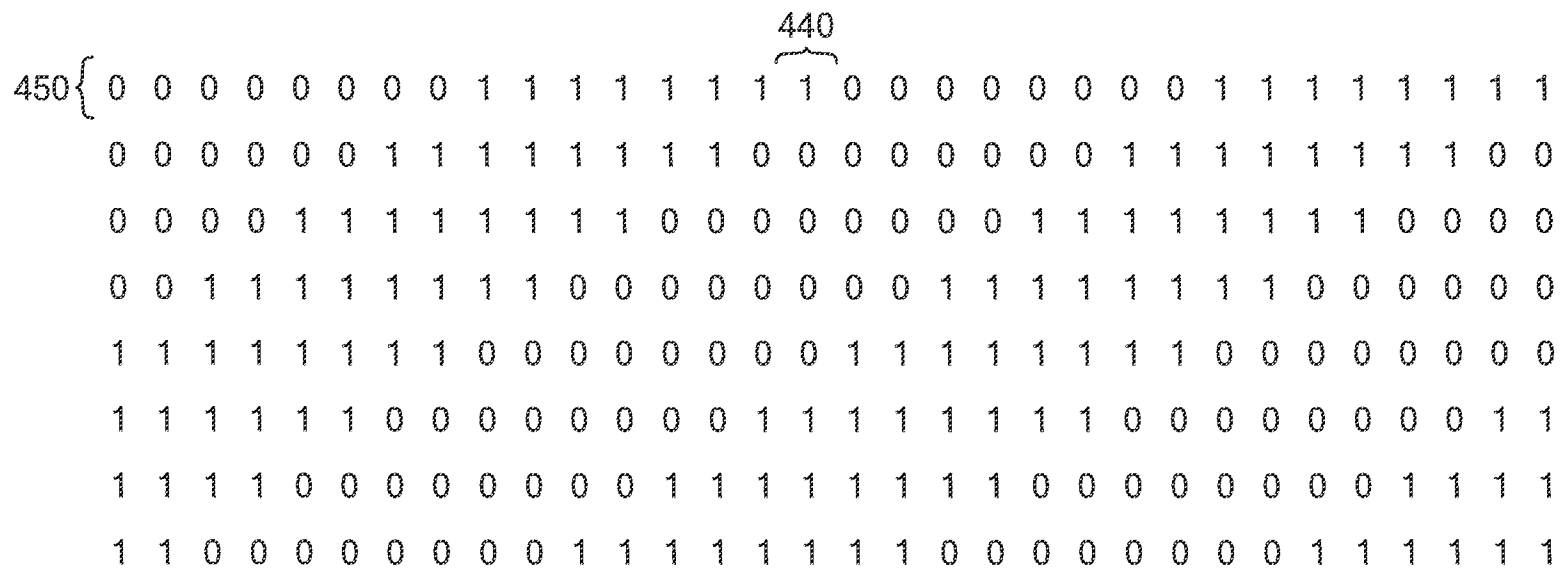

Thus, in accordance with illustrative embodiments, the shifting of the regions enabled by the use of delay lines may be encoded. In this connection, in FIGS. 4 and 4A is shown creation of binary code words using a linear sensor array 400. The sensor array 400 of FIG. 4 is similar to the sensor array 300 of FIG. 3, with irrelevant components omitted, and includes two wave sensors 410 and 420. However, the AoA sectors have been further logically subdivided into eight subsectors 431 to 438, and the corresponding classifier bits (either zero or one) have been indicated in each sector. The concatenation of these classifier bits is shown as an encoded phase difference 440.

It is appreciated that while the illustrative encoded phase difference 440 has eight bits (corresponding to the eight subsectors 431 to 438), any number of bits (respectively sectors) may be used in accordance with the concepts, techniques, and structures taught herein. A person of ordinary skill in the art should understand how varying the number of AoA sectors will modify those teachings. As any number of sectors may be used, illustrative embodiments may be advantageously adapted to a wide variety of uses and applications. In particular, it is appreciated that subsectors need not be the same size, as explained in more detail in connection with FIG. 6, and moreover that phase differences $\phi_i$ may be chosen so that subregions overlap.

FIG. 4A shows a table of such encoded phase differences for a linear array in which pairs of adjacent wave sensors are delayed by fixed delay lines designed specifically for each pair to effect transitions at desired angles. In the exemplary table of FIG. 4A, each of the 32 columns represents an encoded phase difference from a pair of wave sensors that are separated by the characteristic distance D. For example, the encoded phase difference 440 is indicated as occurring as between the 16th and 17th wave sensors.

It is appreciated that while the illustrative linear array thus has 33 sensors, any number of sensors may be used in accordance with the concepts, techniques, and structures taught herein. A person of ordinary skill in the art should understand how varying the number of sensors will modify those teachings. As any number of sensors may be used, illustrative embodiments may be advantageously adapted to a wide variety of uses and applications.

It is also appreciated that some pairs of sensors have delay lines intentionally designed to create the same encoding; that is, their encodings do not differ. This design introduces redundancy into the coding to improve the error correction processes described below. This phenomenon manifests itself as identical adjacent columns in FIG. 4A.

The collection of all such encoded phase differences detected by the sensor array, each output from a single phase detector between adjacent terminals, is a unique 32-bit word, hereinafter called a "code word." Code words are determined as the rows of FIG. 4A; one such row is the code word 450. Each code word may be uniquely associated with an angle of arrival; that is, the angle of arrival of waves to the sensor array that produces that code word when detected.

In accordance with illustrative embodiments, error detection and correction algorithms may be applied advantageously to received code words, using a known or computed collection of noiseless code words, to detect an angle of arrival at very low signal-to-noise ratios (SNRs). In some embodiments, an accurate AoA may be determined even when the SNR is negative; that is, when the noise is more powerful than the detected signal.

One method of performing such error correction is to determine a Hamming distance between the code word digitally output by the phase detectors and each code word in a predefined code book, then select the code word in the code book having the minimum Hamming distance as the likeliest code word that would have been received in the absence of noise. The angle of arrival associated with that likeliest code word then may be output from the sensor array as the detected angle of arrival. However, if the Hamming distance is that of random noise (e.g. sensors randomly output zeros or ones) then the sensor array may output an indication that no signal is detected.

The length of a code word, e.g. the number of columns of the table shown in FIG. 4A, equals the number of encoded phase differences, which may be one fewer than the number of wave sensors in a sensor array. Also, the number of rows of the code word table (that is, the number of different, unique code words) equals the number of distinct subsectors into which angles of arrival may be classified. As indicated in the discussion above, both of these parameters may be varied in practical embodiments according to external design requirements (e.g. cost, size, weight, and power).

FIGS. 5 to 5B schematically show various sensor arrays for detecting AoA having different physical arrangements of sensor elements. Thus, in FIG. 5 is shown a linear sensor array 500 having 10 sensors. The nine phase differences between pairs of adjacent sensors are represented by the labels 510 through 526, and this array 500 would have code words having nine bits each. It is appreciated that any number of sensors may be used in accordance with the concepts, techniques, and structures taught herein.

In FIG. 5A is shown a rectangular sensor array 530 having a horizontal direction and a vertical direction. The rectangular arrangement of the sensor array 530 is advantageous in that the concepts and techniques of error detection and correction (described below) may be applied simultaneously in both of the horizontal and vertical directions, which may correspond to an azimuth and an elevation, respectively. Thus, FIG. 5A shows a measurable phase difference 532 between two horizontally adjacent sensors (or terminals) for use in determining a horizontal AoA, and a measurable phase difference 534 between two vertically adjacent sensors (or terminals) for use in determining a vertical AoA. Such systems use two sets of code words, one for the horizontal direction and another for the vertical direction. In particular, these directions advantageously may be subdivided into different numbers of AoA subsectors.

In FIG. 5B is shown a rectangular sensor array 540 that comprises "vertically" arranged "horizontal" pairs of sensor elements. Each pair of sensors is operable to determine an angle of arrival α in the horizontal plane. In this design, sensor pairs used to produce an encoded phase difference do not share any sensors, as they would in FIGS. 5 and 5A. This approach advantageously allows the rectangular sensor array 540 to be provided perpendicularly to the intended plane of angular measurement. In other words, it permits fine azimuthal angle measurement using a vertical array that in conventional systems could be used only to measure elevation angle. Likewise, it permits fine elevation angle measurement using a horizontal array that in conventional systems could be used only to measure an azimuthal angle.

It is appreciated that any number of such sensor pairs may be oriented in whatever directions are desired to form arrays of arbitrary shape. A person of ordinary skill in the art should understand how to design such arrays, in accordance with the concepts, techniques, and structures taught herein, to provide AoA determination while satisfying various external design requirements.

FIG. 6 indicates, for an illustrative embodiment 600, angles of arrival that are equally spaced in sine space. In this embodiment 600, u=sin(α) is the sine of the angle of arrival, indicated on the horizontal axis of the plot. The range of the sine function u is between −1 and +1, as is known in the art. The volume in front of the array is divided into 33 sectors that are themselves defined by a corresponding 32 equally-spaced values of u. As described above, any number of sectors may be used in embodiments, so this division is purely illustrative. The degree values of α defining the AoA sectors are indicated for each value of u.

It is appreciated that the equal spacing in u-space results in unequal spacing in angular α-space, so the sectors are narrower near the boresight 610 and wider near the angular extremities. For example, the sector containing the boresight 610 is 3.58° wide, while the sector at each extremity is 14.36° wide. However, sectors do not exceed 4° in width until approximately 28° on either side of the boresight, and do not exceed 5° in width until approximately 46° on either side of the boresight, so resolution in α-space is reasonably consistent across a large volume in front of the array.

Having described above a manner of dividing the volume in front of a sensor array into AoA subsectors and obtaining code words from the array on the basis of detecting incident waves in those subsectors, it remains to determine an angle of arrival from a received code word. It is appreciated that certain code words may be detected in the absence of noise, while other code words may be detected in the presence of noise. However, the design of the sensor array taught above advantageously lends itself to rapid, accurate decoding of received code words even in the presence of significant noise using techniques found in the technology of error detection and correction. Thus, illustrative embodiments mix concepts from sensor arrays that involve combining multiple spatial signals, with concepts from error correcting codes that involve combining multiple temporal signals.

Figure 7:
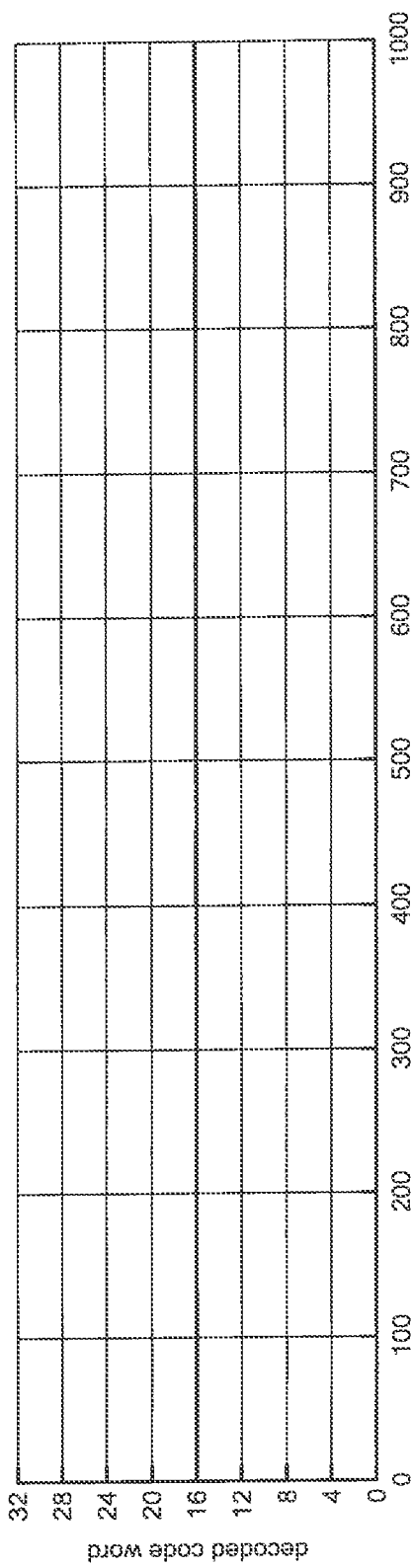
FIGS. 7 to 7C are plots of characteristics of a simulated decoding of a chosen code word at a signal-to-noise ratio (SNR) of 15 decibels (dB)
Figure 7A:
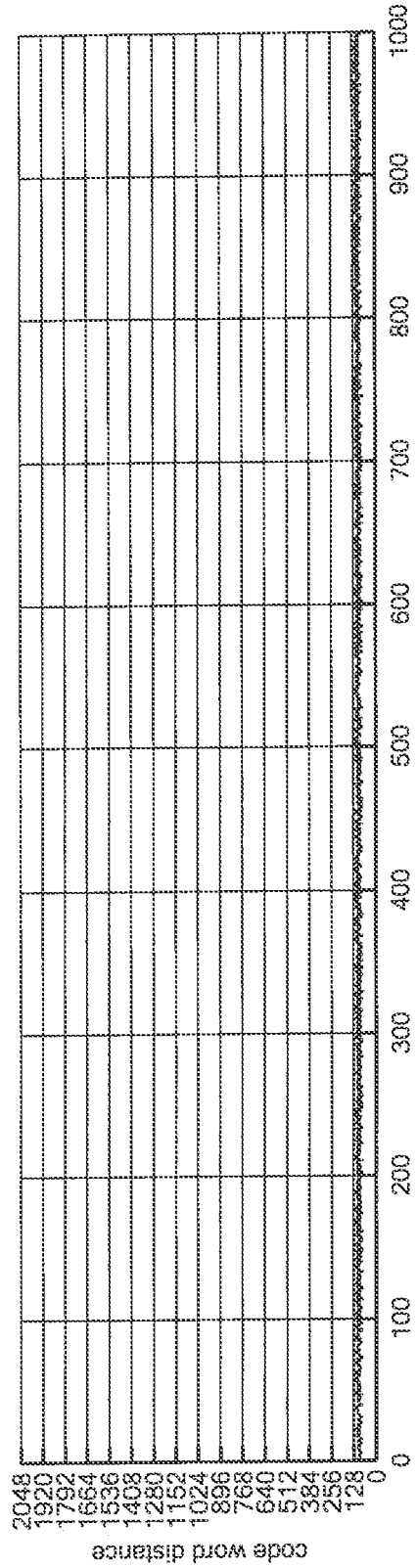
Figure 7B:
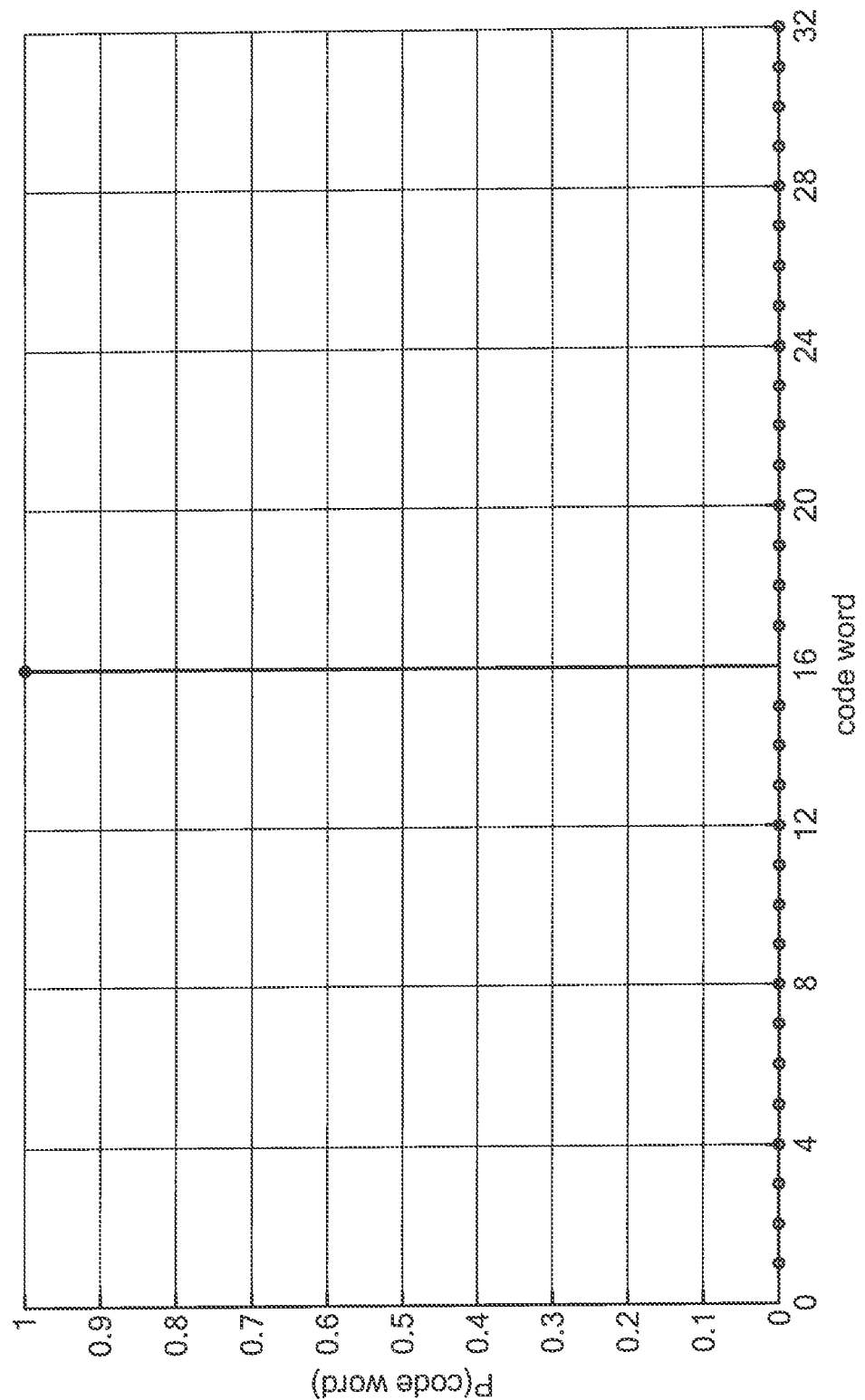
Figure 7C:
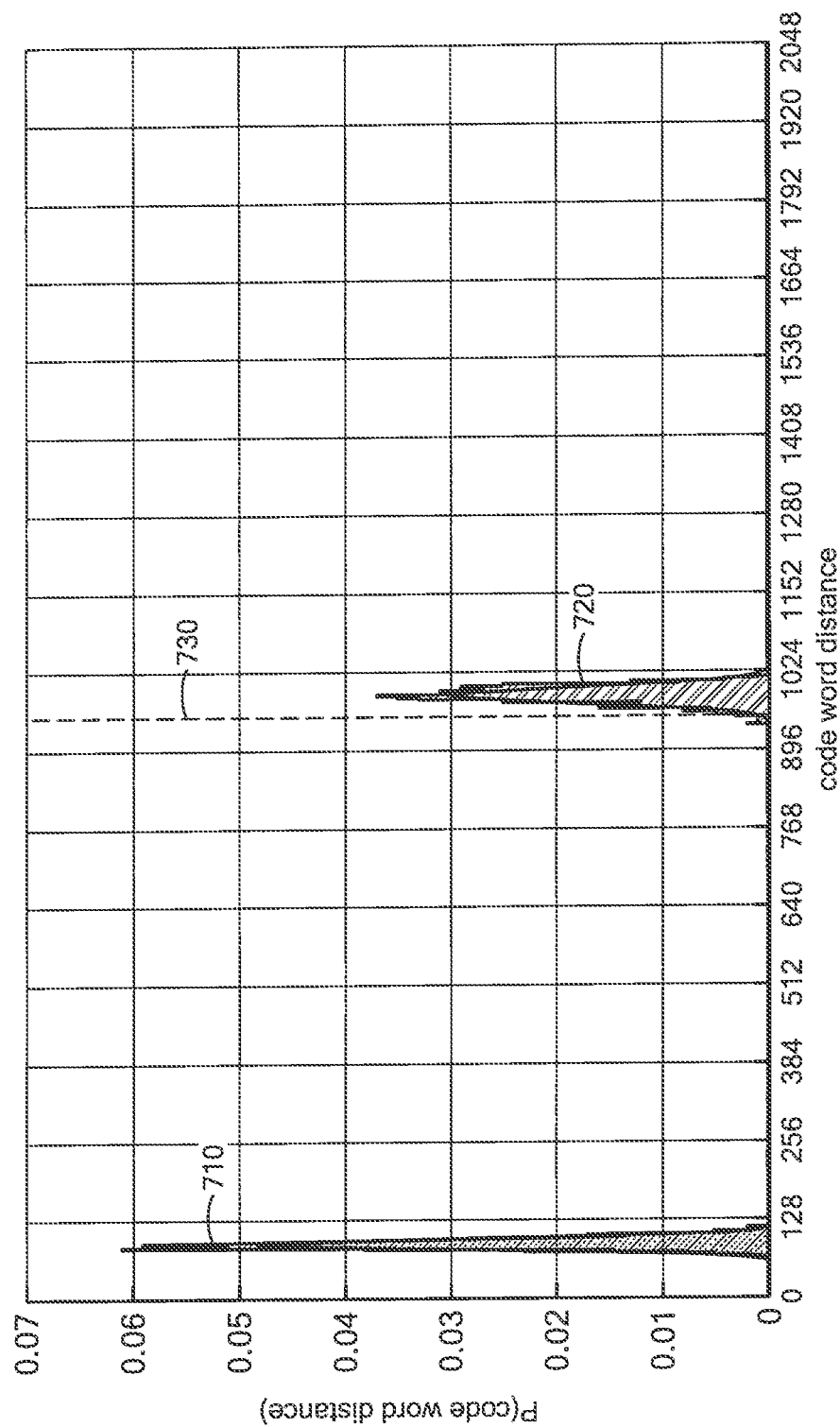

FIGS. 7 to 7C are plots of characteristics of a simulated decoding of a chosen code word at a signal-to-noise ratio (SNR) of 15 decibels (dB). To produce each of these plots, a Monte Carlo simulation was performed on a logical sensor array having $2^{11}$=2048 sensors and $2^5$=32 code words, and incoming waves were simulated that would produce the (arbitrarily-selected) code word 16 in the absence of noise. Random (Gaussian) noise was then added to the environment at an amplitude that was 15 dB less than the wave signal, and the received waves were decoded into code words. Decoding was performed by selecting the noiseless code word having the smallest Hamming distance to the received code word.

FIG. 7 is a plot of which code word was decoded as a function of the simulated iteration. As may be appreciated from this plot, out of 1000 simulated trials, all 1000 were correctly decoded, even in the presence of noise.

FIG. 7A is a plot of which code word was decoded as a function of the number of the simulated iteration. As may be appreciated from this plot, the average code word (i.e. Hamming) distance detected between incoming waves and the corresponding noiseless code word was about 100. In other words, on average, noise altered the classification of about 100 of the sensors each time, from zero to one or from one to zero.

Given the large relative number of sensors in the array (2048 versus 100 in error), no erroneous code words were decoded. Thus, as indicated in FIG. 7B, the probability that the (correct) code word 16 was decoded was 100%.

In FIG. 7C is shown a plot of the probability of the code word distance being detected as a function of the code word distance. It may be appreciated from this Figure that the distribution is strongly bimodal. The left spike 710 represents Hamming distances corrected by the decoding process, while the right spike 720 represents Hamming distances of purely random noise. In accordance with some embodiments, a decoding threshold 730 is introduced, whereby code words having a Hamming distance greater than the decoding threshold 730 represent lack of signal reception. In such cases, the decoder may output an indication that no incident waves were detected.

It is appreciated that decreasing the signal-to-noise ratio (SNR) of the received waves will spread out the left spike 710 and move it closer to the right spike 720 that represents random noise. Eventually, the two spikes 710, 720 will overlap and the distribution will be only weakly bimodal. In such situations, placing the threshold 730 between the two spike nevertheless will result in correct decodings more often than not. Even very weak signals can be detected using hysteresis circuitry (i.e. a memory) for remembering candidate AoA detections: if candidate angles of arrival are detected only intermittently, but they all agree as to a direction, one may build confidence that the detections relate to actual, incident waves. Indeed, receipt of any signal at all makes the distribution bimodal, with one peak at the correct code word and one peak at the mean code word of the random noise.

Figure 8:
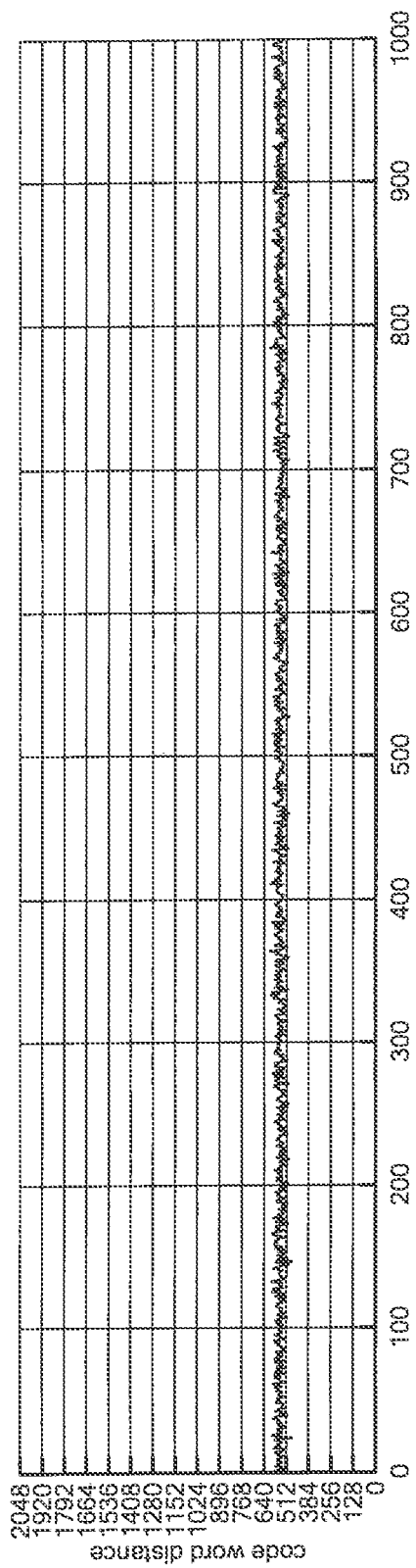
FIGS. 8 to 8C are plots of characteristics of a simulated decoding of a chosen code word at an SNR of 0 dB.
Figure 8A:
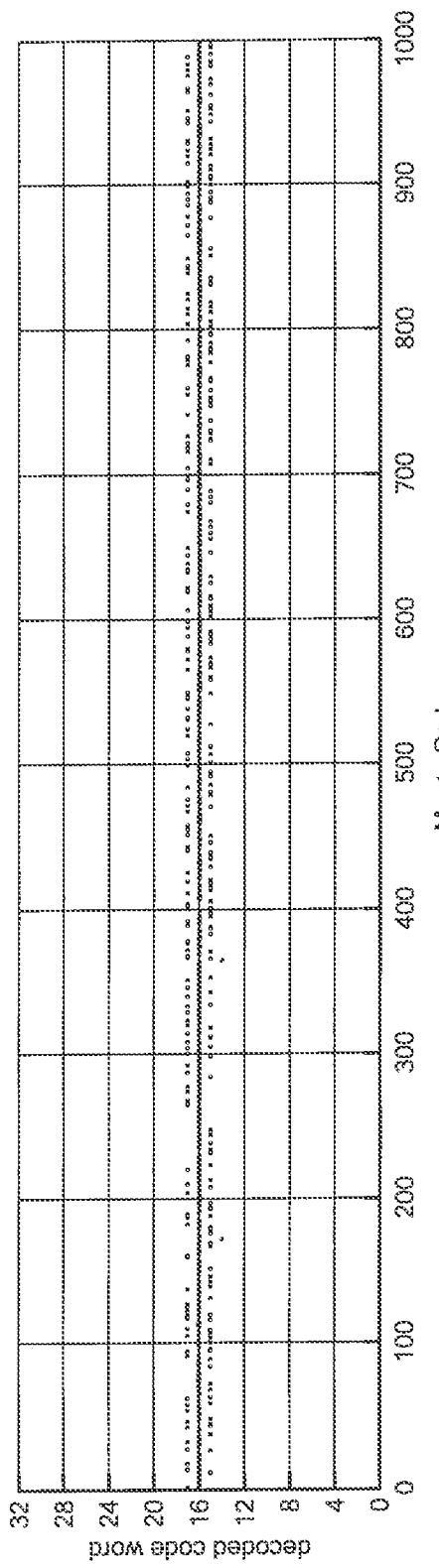
Figure 8B:
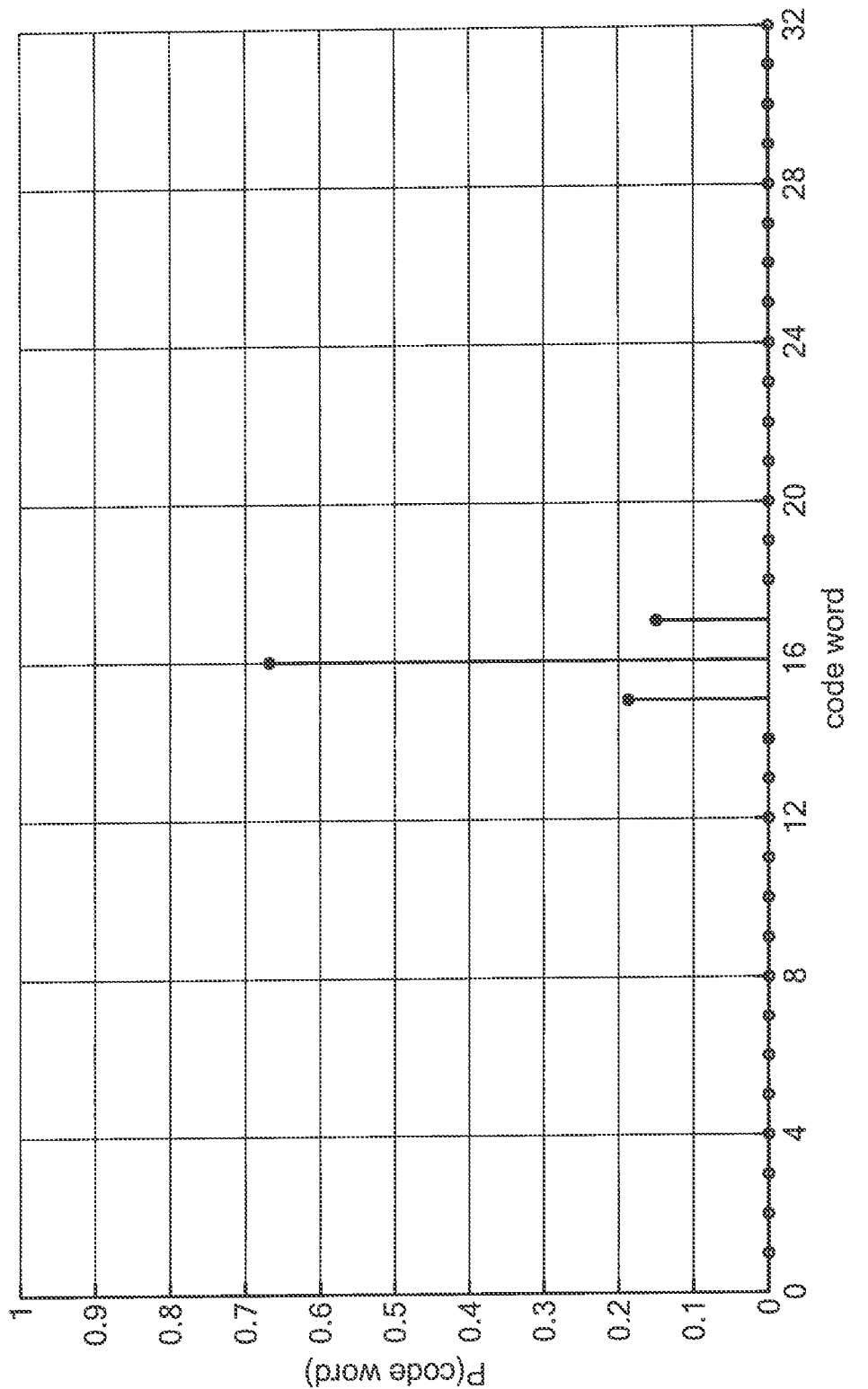
Figure 8C:
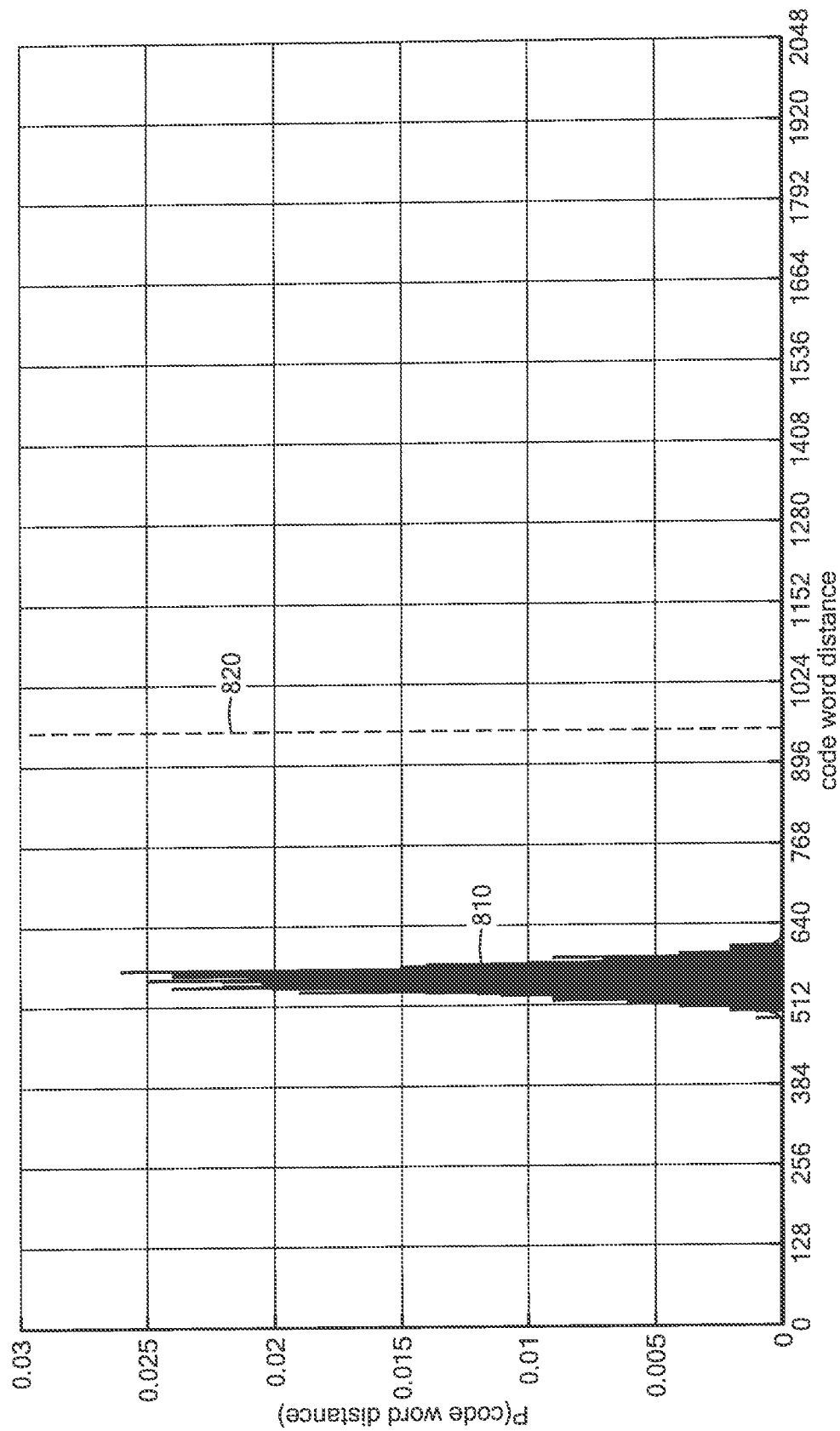

FIGS. 8 to 8C are plots of characteristics of a simulated decoding of a chosen code word at an SNR of 0 dB. These Figures correspond to FIGS. 7 to 7C with either weaker wave signals or stronger noise.

FIG. 8 is a plot of which code word was decoded as a function of the number of the simulated iteration. As may be appreciated from this plot, despite the presence of noise equal in magnitude to the incident wave signal, the majority of decoded code words were the (correct) code word 16, with the bulk of the remaining detections being code words 15 and 17 and only two detections of code word 14. Thus, this simulation demonstrates another advantage of illustrated embodiments: even in the presence of noise, code words that are incorrectly decoded are "near" the correct code word. Put another way, incorrectly decoding a received code word results in an output angle of arrival subsector that is immediately next to the correct angle of arrival subsector, so the approximately correct angle of arrival is nevertheless still detected.

One aspect of the noise may be appreciated by referring to FIG. 8A, which is a plot of the code word distance as a function of the simulated iteration. Unlike FIG. 7A, the average code word (i.e. Hamming) distance detected between incoming waves and the corresponding noiseless code word was about 550. In other words, on average, noise altered the classification of over one quarter of the sensors each time. Nevertheless, the sensor array decoded the correct code word most of the time.

In FIG. 8B is shown the probability that the code word was decoded as a function of which code word was detected. As explained above, the most frequently detected code word was the correct code word 16 (about two-thirds of the time), while the only other code words detected were code word 14 (0.02%), code word 15, and code word 17. Random noise errors will widen this type of distribution approximately equally on both sides. It is thus appreciated that averaging this type of distribution can cancel this effect, and it is observed that the average of the distribution shown in FIG. 8B indeed is very close to 16, which is the correct code word. It is also the mode of the distribution, providing another indication that the decoding is correct.

In FIG. 8C is shown a plot of the probability of the code word distance being detected as a function of the code word distance. Only the spike 810 indicating detected code word distance is shown; the spike showing the random noise is not shown. The distribution is centered around a code word distance of approximately 560. A code word threshold distance 820 of about 950 bits is indicated, as it was in FIG. 7C.

Figure 9:
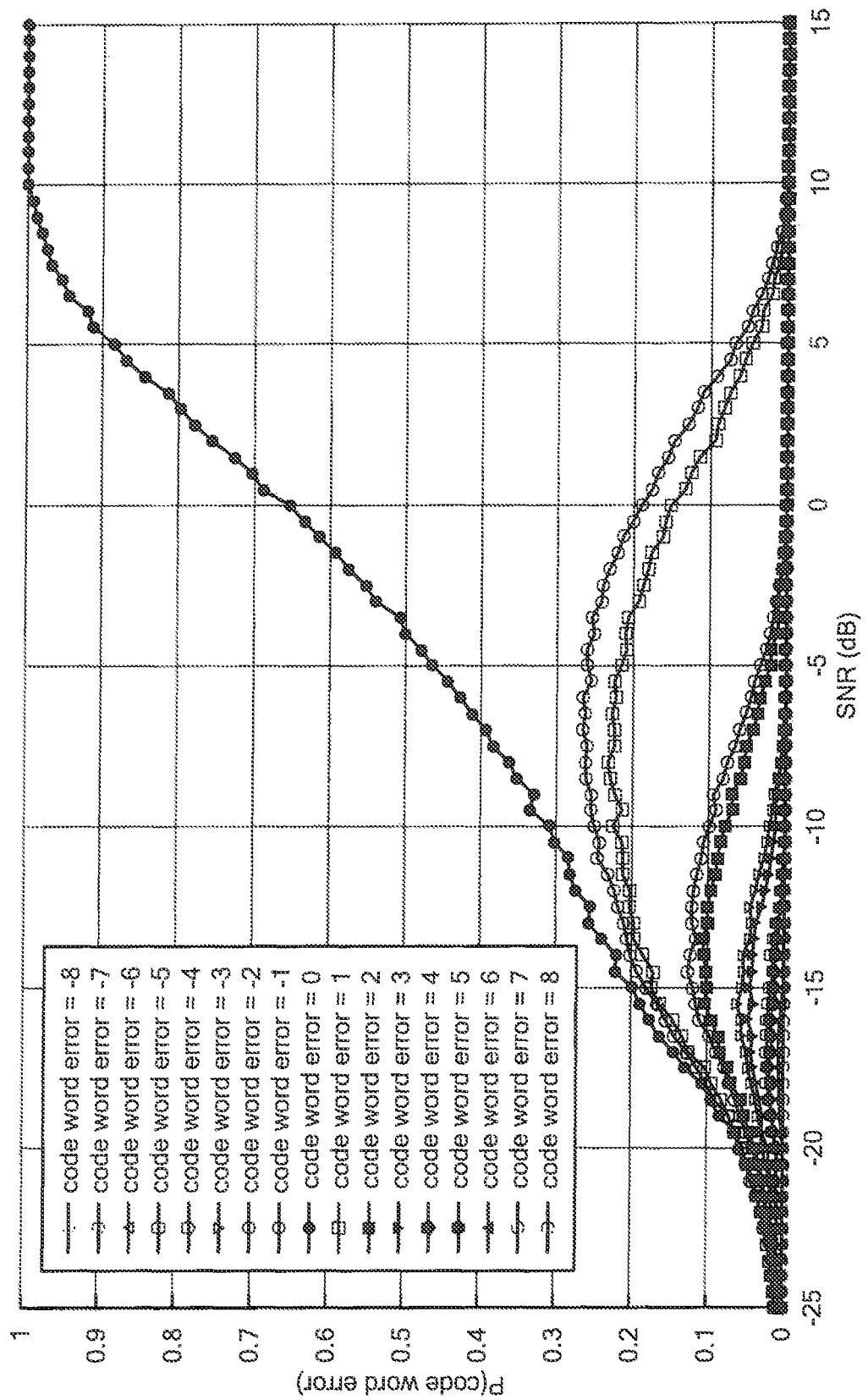
FIG. 9 is a plot of a simulated probability of correctly decoding a received code word as a function of SNR.

FIG. 9 is a plot of a simulated probability of correctly decoding a received code word as a function of SNR. Thus, the points for a SNR of 15 dB, at the very right of the plot, correspond to FIGS. 7 to 7C, while the points for a SNR of 0 dB correspond to FIGS. 8 to 8C.

It may be appreciated from this FIG. 9 that the simulated sensor array always decodes the correct code word (and, by extension, the angle of arrival) down to a SNR of about 11 dB, at which errors begin to occur. These errors are single-adjacency errors; that is, an incorrect but neighboring code word (and by extension, neighboring angle of arrival subsector) is detected. Double-adjacency errors do not begin to occur until a SNR of 0 dB—when the noise is as strong as the signal. Treble-adjacency errors do not begin to occur until a SNR of −5 dB, and so on.

It is appreciated that the mode of the probability-versus-code word distribution remains the correct code word well below −15 SNR. It is further appreciated that the average of this distribution approximates the correct codeword at even lower SNR, since random noise tends to widen the distribution approximately equally around the mode.

Figure 10:
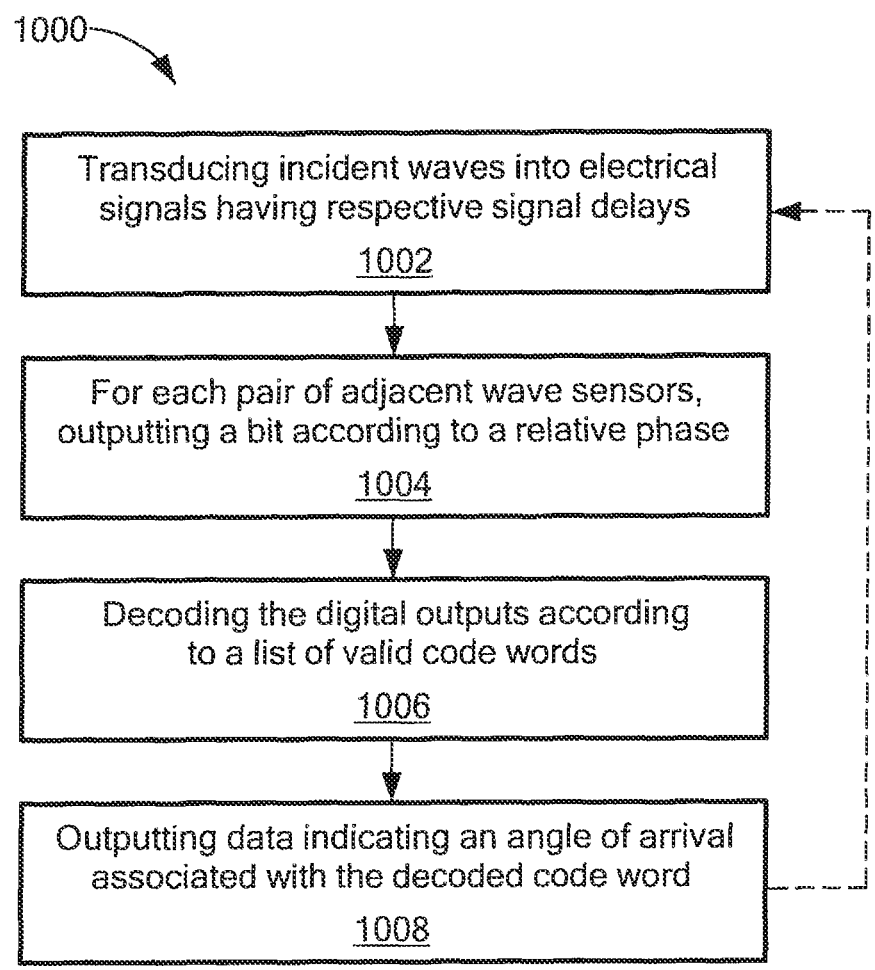
FIG. 10 is a flowchart for a method of determining an AoA of an incident wave.

In FIG. 10 is shown a flowchart 1000 for a method of determining an angle of arrival of an incident wave. A process 1002 requires transducing incident waves into electrical signals having respective signal delays. The process 1002 may be performed, for example, as taught in connection with FIGS. 1 to 3 above. Next, a process 1004 requires, for each pair of adjacent wave sensors, outputting a bit (i.e. a digital zero or one) according to a relative phase between the electrical signals. The process 1004 may be performed, for example, by a phase detector to produce an encoded phase difference, as taught above in connection with FIG. 4. Then, a process 1006 requires decoding the digital outputs (i.e. the encoded phase differences) according to a list of valid code words. The list of valid code words may be produced, for example, as rows of a table as taught in connection with FIG. 4A, while decoding may be performed by selecting a minimum Hamming distance between the received code word and each of the valid code words. Finally, a process 1008 requires outputting data indicating an angle of arrival associated with the decoded code word. That is, the process 1008 determines, for the decoded code word, an associated angle of arrival (e.g. via a table lookup), and outputs data that indicate the angle of arrival.

Figure 11:
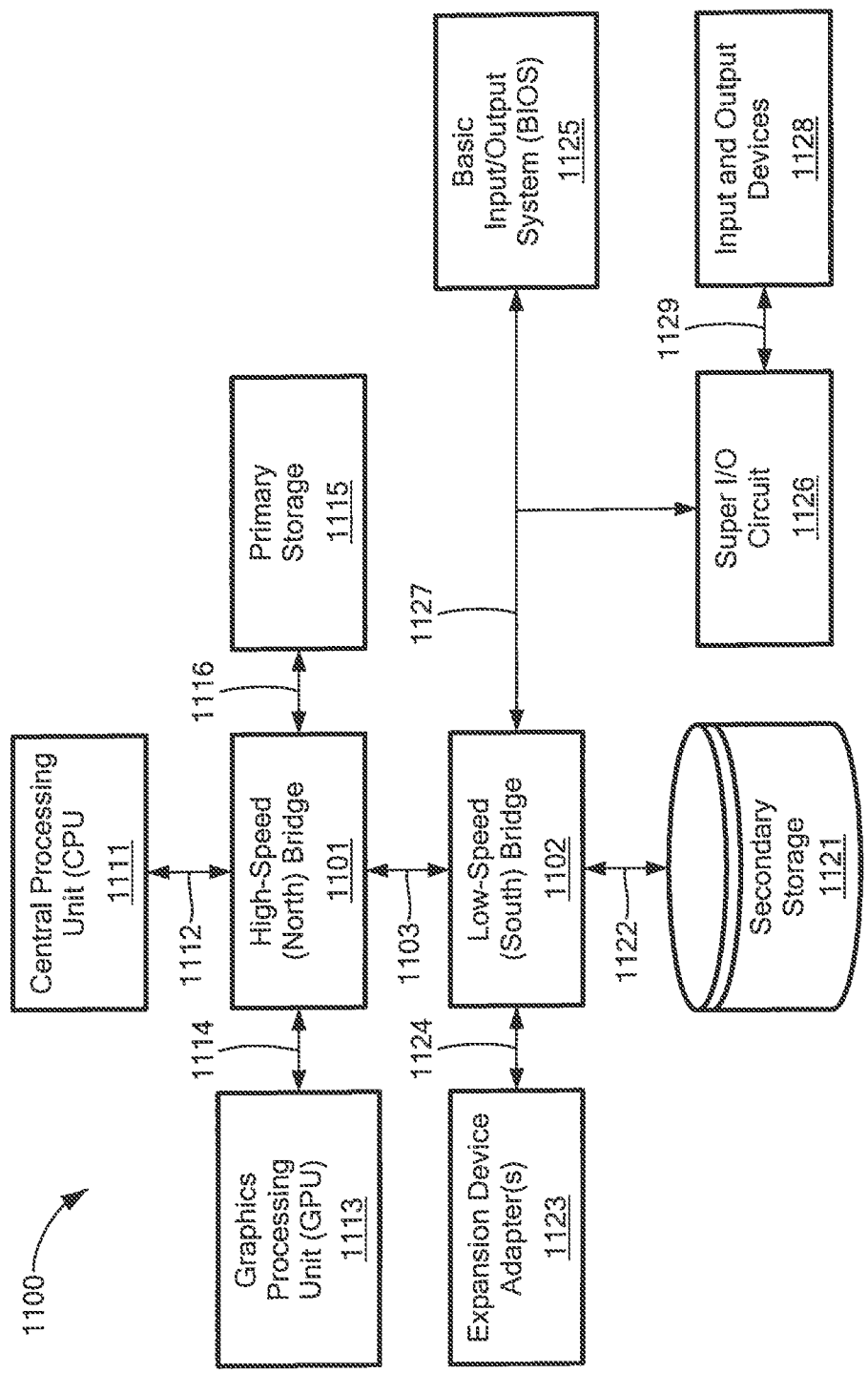
FIG. 11 schematically shows relevant physical components of a computer processing system embodiment, and their respective relationships.

In FIG. 11 is shown relevant physical components of a computer processing system 1100 embodiment, and their respective relationships. Generally, the computer 1100 has many functional components that communicate data with each other using data buses. The functional components of FIG. 11 are physically arranged based on the speed at which each must operate, and the technology used to communicate data using buses at the necessary speeds to permit such operation.

Thus, the computer 1100 is arranged as high-speed components and buses 1111-1116 and low-speed components and buses 1121-1129. The high-speed components and buses 1111-1116 are coupled for data communication using a high-speed bridge 1101, also called a "northbridge," while the low-speed components and buses 1121-1129 are coupled using a low-speed bridge 1102, also called a "southbridge."

The computer 1100 includes a central processing unit ("CPU") 1111 coupled to the high-speed bridge 1101 via a bus 1112. The CPU 1111 is electronic circuitry that carries out the instructions of a computer program. As is known in the art, the CPU 1111 may be implemented as a microprocessor; that is, as an integrated circuit ("IC"; also called a "chip" or "microchip"). In some embodiments, the CPU 1111 may be implemented as a microcontroller for embedded applications, or according to other embodiments known in the art.

The bus 1112 may be implemented using any technology known in the art for interconnection of CPUs (or more particularly, of microprocessors). For example, the bus 1112 may be implemented using the HyperTransport architecture developed initially by AMD, the Intel QuickPath Interconnect ("QPI"), or a similar technology. In some embodiments, the functions of the high-speed bridge 1101 may be implemented in whole or in part by the CPU 1111, obviating the need for the bus 1112.

The computer 1100 includes one or more graphics processing units (GPUs) 1113 coupled to the high-speed bridge 1101 via a graphics bus 1114. Each GPU 1113 is designed to process commands from the CPU 1111 into image data for display on a display screen (not shown). In some embodiments, the CPU 1111 performs graphics processing directly, obviating the need for a separate GPU 1113 and graphics bus 1114. In other embodiments, a GPU 1113 is physically embodied as an integrated circuit separate from the CPU 1111 and may be physically detachable from the computer 1100 if embodied on an expansion card, such as a video card. The GPU 1113 may store image data (or other data, if the GPU 1113 is used as an auxiliary computing processor) in a graphics buffer.

The graphics bus 1114 may be implemented using any technology known in the art for data communication between a CPU and a GPU. For example, the graphics bus 1114 may be implemented using the Peripheral Component Interconnect Express ("PCI Express" or "PCIe") standard, or a similar technology.

The computer 1100 includes a primary storage 1115 coupled to the high-speed bridge 1101 via a memory bus 1116. The primary storage 1115, which may be called "main memory" or simply "memory" herein, includes computer program instructions, data, or both, for use by the CPU 1111. The primary storage 1115 may include random-access memory ("RAM"). RAM is "volatile" if its data are lost when power is removed, and "non-volatile" if its data are retained without applied power. Typically, volatile RAM is used when the computer 1100 is "awake" and executing a program, and when the computer 1100 is temporarily "asleep", while non-volatile RAM ("NVRAM") is used when the computer 1100 is "hibernating"; however, embodiments may vary. Volatile RAM may be, for example, dynamic ("DRAM"), synchronous ("SDRAM"), and double-data rate ("DDR SDRAM"). Non-volatile RAM may be, for example, solid-state flash memory. RAM may be physically provided as one or more dual in-line memory modules ("DIMMs"), or other, similar technology known in the art.

The memory bus 1116 may be implemented using any technology known in the art for data communication between a CPU and a primary storage. The memory bus 1116 may comprise an address bus for electrically indicating a storage address, and a data bus for transmitting program instructions and data to, and receiving them from, the primary storage 1115. For example, if data are stored and retrieved 64 bits (eight bytes) at a time, then the data bus has a width of 64 bits. Continuing this example, if the address bus has a width of 32 bits, then 232 memory addresses are accessible, so the computer 1100 may use up to $8*2^{32}=32$ gigabytes (GB) of primary storage 1115. In this example, the memory bus 1116 will have a total width of 64+32=116 bits. The computer 1100 also may include a memory controller circuit (not shown) that converts electrical signals received from the memory bus 1116 to electrical signals expected by physical pins in the primary storage 1115, and vice versa.

Computer memory may be hierarchically organized based on a tradeoff between memory response time and memory size, so depictions and references herein to types of memory as being in certain physical locations are for illustration only. Thus, some embodiments (e.g. embedded systems) provide the CPU 1111, the graphics processing units 1113, the primary storage 1115, and the high-speed bridge 1101, or any combination thereof, as a single integrated circuit. In such embodiments, buses 1112, 1114, 1116 may form part of the same integrated circuit and need not be physically separate. Other designs for the computer 1100 may embody the functions of the CPU 1111, graphics processing units 1113, and the primary storage 1115 in different configurations, obviating the need for one or more of the buses 1112, 1114, 1116.

The depiction of the high-speed bridge 1101 coupled to the CPU 1111, GPU 1113, and primary storage 1115 is merely exemplary, as other components may be coupled for communication with the high-speed bridge 1101. For example, a network interface controller ("NIC" or "network adapter") may be coupled to the high-speed bridge 1101, for transmitting and receiving data using a data channel. The NIC may store data to be transmitted to, and received from, the data channel in a network data buffer.

The high-speed bridge 1101 is coupled for data communication with the low-speed bridge 1102 using an internal data bus 1103. Control circuitry (not shown) may be required for transmitting and receiving data at different speeds. The internal data bus 1103 may be implemented using the Intel Direct Media Interface ("DMI") or a similar technology.

The computer 1100 includes a secondary storage 1121 coupled to the low-speed bridge 1102 via a storage bus 1122. The secondary storage 1121, which may be called "auxiliary memory", "auxiliary storage", or "external memory" herein, stores program instructions and data for access at relatively low speeds and over relatively long durations. Since such durations may include removal of power from the computer 1100, the secondary storage 1121 may include non-volatile memory (which may or may not be randomly accessible).

Non-volatile memory may comprise solid-state memory having no moving parts, for example a flash drive or solid-state drive. Alternately, non-volatile memory may comprise a moving disc or tape for storing data and an apparatus for reading (and possibly writing) the data. Data may be stored (and possibly rewritten) optically, for example on a compact disc ("CD"), digital video disc ("DVD"), or Blu-ray disc ("BD"), or magnetically, for example on a disc in a hard disk drive ("HDD") or a floppy disk, or on a digital audio tape ("DAT"). Non-volatile memory may be, for example, read-only ("ROM"), write-once read-many ("WORM"), programmable ("PROM"), erasable ("EPROM"), or electrically erasable ("EEPROM").

The storage bus 1122 may be implemented using any technology known in the art for data communication between a CPU and a secondary storage and may include a host adaptor (not shown) for adapting electrical signals from the low-speed bridge 1102 to a format expected by physical pins on the secondary storage 1121, and vice versa. For example, the storage bus 1122 may use a Universal Serial Bus ("USB") standard; a Serial AT Attachment ("SATA") standard; a Parallel AT Attachment ("PATA") standard such as Integrated Drive Electronics ("IDE"), Enhanced IDE ("EIDE"), ATA Packet Interface ("ATAPI"), or Ultra ATA; a Small Computer System Interface ("SCSI") standard; or a similar technology.

The computer 1100 also includes one or more expansion device adapters 1123 coupled to the low-speed bridge 1102 via a respective one or more expansion buses 1124. Each expansion device adapter 1123 permits the computer 1100 to communicate with expansion devices (not shown) that provide additional functionality. Such additional functionality may be provided on a separate, removable expansion card, for example an additional graphics card, network card, host adaptor, or specialized processing card.

Each expansion bus 1124 may be implemented using any technology known in the art for data communication between a CPU and an expansion device adapter. For example, the expansion bus 1124 may transmit and receive electrical signals using a Peripheral Component Interconnect ("PCI") standard, a data networking standard such as an Ethernet standard, or a similar technology.

The computer 1100 includes a basic input/output system (BIOS) 1125 and a Super I/O circuit 1126 coupled to the low-speed bridge 1102 via a bus 1127. The BIOS 1125 is a non-volatile memory used to initialize the hardware of the computer 1100 during the power-on process. The Super I/O circuit 1126 is an integrated circuit that combines input and output ("I/O") interfaces for low-speed input and output devices 1128, such as a serial mouse and a keyboard. In some embodiments, BIOS functionality is incorporated in the Super I/O circuit 1126 directly, obviating the need for a separate BIOS 1125.

The bus 1127 may be implemented using any technology known in the art for data communication between a CPU, a BIOS (if present), and a Super I/O circuit. For example, the bus 1127 may be implemented using a Low Pin Count ("LPC") bus, an Industry Standard Architecture ("ISA") bus, or similar technology. The Super I/O circuit 1126 is coupled to the I/O devices 1128 via one or more buses 1129. The buses 1129 may be serial buses, parallel buses, other buses known in the art, or a combination of these, depending on the type of I/O devices 1128 coupled to the computer 1100.

The techniques and structures described herein may be implemented in any of a variety of different forms. For example, features of embodiments may be embodied within various forms of communication devices, both wired and wireless; television sets; set top boxes; audio/video devices; laptop, palmtop, desktop, and tablet computers with or without wireless capability; personal digital assistants (PDAs); telephones; pagers; satellite communicators; cameras having communication capability; network interface cards (NICs) and other network interface structures; base stations; access points; integrated circuits; as instructions and/or data structures stored on machine readable media; and/or in other formats. Examples of different types of machine readable media that may be used include floppy diskettes, hard disks, optical disks, compact disc read only memories (CD-ROMs), digital video disks (DVDs), Blu-ray disks, magneto-optical disks, read only memories (ROMs), random access memories (RAMs), erasable programmable ROMs (EPROMs), electrically erasable programmable ROMs (EEPROMs), magnetic or optical cards, flash memory, and/or other types of media suitable for storing electronic instructions or data.

In the foregoing detailed description, various features of embodiments are grouped together in one or more individual embodiments for the purpose of streamlining the disclosure. This method of disclosure is not to be interpreted as reflecting an intention that the claims require more features than are expressly recited therein. Rather, inventive aspects may lie in less than all features of each disclosed embodiment.

Having described implementations which serve to illustrate various concepts, structures, and techniques which are the subject of this disclosure, it will now become apparent to those of ordinary skill in the art that other implementations incorporating these concepts, structures, and techniques may be used. Accordingly, it is submitted that that scope of the patent should not be limited to the described implementations but rather should be limited only by the spirit and scope of the following claims.

What is claimed is:

1. A system for detecting an angle of arrival of incident waves, the system comprising:
   a plurality of wave sensors, each wave sensor for transducing the incident waves into an electrical signal, each wave sensor coupled to a corresponding electrical terminal according to a respective electrical signal delay;
   a plurality of phase detectors, each phase detector coupled to two such electrical terminals for digitally outputting either a one or a zero according to a relative phase of electrical signals present at the two terminals; and
   a decoder, coupled to the plurality of phase detectors, configured to output, as data indicating the angle of arrival of the incident waves, a decoding of the digital output of the plurality of phase detectors.

2. The system according to claim 1, wherein the plurality of wave sensors comprises a pressure sensor, or a photodetector, or a radio frequency (RF) antenna element.

3. The system according to claim 1, wherein the plurality of phase detectors comprises an electric signal difference circuit, or an electric signal mixer, or a lead-lag detector.

4. The system according to claim 1, wherein the decoder is configured to:
   determine a Hamming distance between the digital output of the plurality of phase detectors and each code word in a predefined code book; and
   output as the data indicating the angle of arrival, an angular value associated with the code word having a minimum such Hamming distance.

5. The system according to claim 1, wherein the decoder is configured to:
   determine a Hamming distance between the digital output of the plurality of phase detectors and each code word in a predefined code book; and
   output an indication that no incident waves were detected when the minimum Hamming distance is greater than a given threshold.

6. The system according to claim 1, wherein the plurality of wave sensors are physically arranged as a linear array.

7. The system according to claim 1, wherein the plurality of wave sensors are physically arranged as a rectangular array having a horizontal direction and a vertical direction.

8. The system according to claim 7, wherein:
   the plurality of phase detectors includes a plurality of horizontal phase detectors, each coupled to two horizontally adjacent terminals, and a plurality of vertical phase detectors, each coupled to two vertically adjacent terminals; and
   the decoder is configured to output both a decoding of the digital output of the plurality of horizontal phase detectors as a horizontal angle of arrival, and a decoding of the digital output of the plurality of vertical phase detectors as a vertical angle of arrival.

9. A method of detecting an angle of arrival of incident waves, the method comprising:
- transducing the incident waves by a plurality of wave sensors into a corresponding plurality of electrical signals, each such electrical signal having a respective electrical signal delay;
- for each pair of adjacent wave sensors, digitally outputting to a decoder either a one or a zero according to a relative phase of their corresponding electrical signals; and
- outputting, by the decoder as data indicating the angle of arrival of the incident waves, a decoding of the digital outputs.

10. The method according to claim 9, wherein transducing comprises transducing using a pressure sensor, or a photodetector, or a radio frequency (RF) antenna element.

11. The method according to claim 9, wherein digitally outputting comprises digitally outputting from an electric signal difference circuit, or an electric signal mixer, or a lead-lag detector.

12. The method according to claim 9, further comprising:
- determining a Hamming distance between the digital output of the plurality of phase detectors and each code word in a predefined code book; and
- outputting as the data indicating the angle of arrival, an angular value associated with the code word having a minimum such Hamming distance.

13. The method according to claim 9, further comprising:
- determining a Hamming distance between the digital output of the plurality of phase detectors and each code word in a predefined code book; and
- outputting an indication that no incident waves were detected when the minimum Hamming distance is greater than a given threshold.

14. The method according to claim 9, wherein the plurality of wave sensors is arranged as a rectangular array having a horizontal direction and a vertical direction, and wherein outputting by the decoder comprises outputting both a decoding of the digital outputs of horizontally adjacent wave sensors as a horizontal angle of arrival, and a decoding of the digital outputs of vertically adjacent wave sensors as a vertical angle of arrival.

15. A tangible, computer-readable storage medium, in which is non-transitorily stored computer program code for performing a method of detecting an angle of arrival of incident waves, the method comprising:
- transducing the incident waves by a plurality of wave sensors into a corresponding plurality of electrical signals, each such electrical signal having a respective electrical signal delay;
- for each pair of adjacent wave sensors, digitally outputting to a decoder either a one or a zero according to a relative phase of their corresponding electrical signals; and
- outputting, by the decoder as data indicating the angle of arrival of the incident waves, a decoding of the digital outputs.

16. The storage medium according to claim 15, wherein transducing comprises transducing using a pressure sensor, or a photodetector, or a radio frequency (RF) antenna element.

17. The storage medium according to claim 15, wherein digitally outputting comprises digitally outputting from an electric signal difference circuit, or an electric signal mixer, or a lead-lag detector.

18. The storage medium according to claim 15, the method further comprising:
- determining a Hamming distance between the digital output of the plurality of phase detectors and each code word in a predefined code book; and
- outputting as the data indicating the angle of arrival, an angular value associated with the code word having a minimum such Hamming distance.

19. The storage medium according to claim 15, the method further comprising:
- determining a Hamming distance between the digital output of the plurality of phase detectors and each code word in a predefined code book; and
- outputting an indication that no incident waves were detected when the minimum Hamming distance is greater than a given threshold.

20. The storage medium according to claim 15, wherein the plurality of wave sensors is arranged as a rectangular array having a horizontal direction and a vertical direction, and wherein outputting by the decoder comprises outputting both a decoding of the digital outputs of horizontally adjacent wave sensors as a horizontal angle of arrival, and a decoding of the digital outputs of vertically adjacent wave sensors as a vertical angle of arrival.

* * * * *